US008659326B1

(12) United States Patent
Claydon et al.

(10) Patent No.: US 8,659,326 B1
(45) Date of Patent: Feb. 25, 2014

(54) SWITCHING APPARATUS INCLUDING GATING CIRCUITRY FOR ACTUATING MICRO-ELECTROMECHANICAL SYSTEM (MEMS) SWITCHES

(71) Applicant: General Electric Company, Schenectady, NY (US)

(72) Inventors: Glenn Claydon, Wynantskill, NY (US); Christopher Fred Keimel, Schenectady, NY (US); John Norton Park, Rexford, NY (US); Bo Li, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/630,122

(22) Filed: Sep. 28, 2012

(51) Int. Cl.
*H03K 3/00* (2006.01)

(52) U.S. Cl.
USPC .......................................... 327/108; 327/112

(58) Field of Classification Search
USPC .............................. 327/108, 112; 326/82, 83
See application file for complete search history.

(56) References Cited

U.S. PATENT DOCUMENTS 7,321,275 B2 1/2008 Chou et al.
7,332,835 B1 2/2008 Wright et al.
7,554,222 B2 * 6/2009 Kumfer et al. ................ 307/113
7,839,611 B2 11/2010 Rivers, Jr. et al.
7,859,360 B2 * 12/2010 Rofougaran et al. ......... 333/105
8,350,509 B2 * 1/2013 Anand et al. ............. 318/400.26
2002/0186108 A1 12/2002 Hallbjorner
2008/0164961 A1 7/2008 Premerlani et al.
2009/0159409 A1 6/2009 Keimel et al.
2011/0198967 A1 8/2011 Aimi
2011/0308924 A1 12/2011 Kishore et al.

FOREIGN PATENT DOCUMENTS

EP 1965404 A2 9/2008

* cited by examiner

*Primary Examiner* — Kenneth B. Wells
(74) *Attorney, Agent, or Firm* — Joseph J. Christian

(57) ABSTRACT

A switching apparatus, as may be configured to actuate stacked MEMS switches, may include a switching circuitry (34) including a MEMS switch (36) having a beam (16) made up of a first movable actuator (17) and a second movable actuator (19) electrically connected by a common connector (20) and arranged to selectively establish an electrical current path through the first and second movable actuators in response to a gate control signal applied to the gates of the switch to actuate the movable actuators. The apparatus may further include a gating circuitry (32) to generate the gate control signal applied to gates of the switch. The gating circuitry may include a driver channel (40) electrically coupled to the common connector and may be adapted to electrically float with respect to a varying beam voltage, and may be electrically referenced between the varying beam voltage and a local electrical ground of the gating circuitry.

28 Claims, 4 Drawing Sheets

SWITCHING APPARATUS INCLUDING GATING CIRCUITRY FOR ACTUATING MICRO-ELECTROMECHANICAL SYSTEM (MEMS) SWITCHES

FIELD OF THE INVENTION

Aspects of the present invention relate generally to a switching apparatus for selectively switching a current in a current path, and, more particularly, to an apparatus based on micro-electromechanical systems (MEMS) switches, and even more particularly to a switching apparatus including gating circuitry configured to actuate stackable arrays of MEMS-based switches, such as Back-to-Back (B2B) structural arrangements of serially and/or parallel-stacked MEMS switches.

BACKGROUND OF THE INVENTION

It is known to connect MEMS switches to form a switching array, such as series connected modules of parallel switches, and parallel connected modules of series switches. An array of switches may be needed because a single MEMS switch may not be capable of either conducting enough current, and/or holding off enough voltage, as may be required in a given switching application.

An important property of such switching arrays is the way in which each of the switches contributes to the overall voltage and current rating of the array. Ideally, the current rating of the array should be equal to the current rating of a single switch times the number of parallel branches of switches, for any number of parallel branches. Such an array would be said to be current scaleable. Current scaling has been achieved in practical switching arrays, such as through on-chip geometry and interconnect patterning. Voltage scaling has been more challenging to achieve, as this may involve passive elements in addition to the switching structure.

In concept, the voltage rating of the array should be equal to the voltage rating of a single switch times the number of switches in series. However, achieving voltage scaling in practical switching arrays has presented difficulties. For instance, serially-stacked switches involving B2B switching structures may present unique challenges such as due to the need to isolate (e.g., from cross talk) the voltage that controls the switching operation and the voltage being switched. More specifically, a B2B switching structure generally involves a voltage reference location (e.g., midpoint of the B2B structure) that should reference the beam voltage to the voltage controlling beam actuation (the gating voltage). For example, the midpoint of the B2B structure, if not appropriately electrically referenced, could electrically float, and in a series-stacking of such switches, this could lead to the formation of a relative large differential voltage across a free end of a movable beam of the switch and a stationary contact, (e.g., exceeding the "with-stand" voltage ratings of a given switch) which could damage the switch when the switch is actuated to a closed condition.

BRIEF DESCRIPTION OF THE INVENTION

Generally, aspects of the present invention may provide innovative gating control of a micro-electromechanical systems (MEMS) switching array, where the gating control may be effectively adapted for referencing and balancing gating signals in a stackable architecture of the switches that make up the array. In one example embodiment, a switching apparatus may include a switching circuitry comprising at least one micro-electromechanical system switch having a beam comprising a first movable actuator and a second movable actuator jointly electrically connected by a common connector and arranged to selectively establish an electrical current path through the first and second movable actuators in response to a single gate control signal applied to respective first and second gates of the switch to actuate the first and second movable actuators of the switch. The apparatus may further include a gating circuitry to generate the single gate control signal applied to the first and second gates of the switch. The gating circuitry may comprise a driver channel electrically coupled to the common connector of the switch and may be adapted to electrically float with respect to a varying beam voltage, and may be electrically referenced between the varying beam voltage and a local electrical ground of the gating circuitry.

Further aspects of the present invention, in another example embodiment may provide a switching apparatus, which may include a switching circuitry comprising at least one micro-electromechanical system switch having a beam comprising a first movable actuator and a second movable actuator jointly electrically connected by a common connector and arranged to selectively establish an electrical current path through the first and second movable actuators in response to a single gate control signal applied to respective first and second gates of the switch to actuate the first and second movable actuators of the switch. A gating circuitry may be used to generate the single gate control signal applied to the first and second gates of the switch. The gating circuitry may comprise a driver channel electrically coupled to the common connector of the switch and adapted to electrically float with respect to a varying beam voltage, and electrically referenced between the varying beam voltage and a local electrical ground of the gating circuitry. The switching circuitry may comprise a plurality of respective micro-electromechanical system switches connected in series circuit to one another to establish the current path through the first and second movable actuators of each respective switch. The gating circuitry may comprise a corresponding plurality of respective gating circuitries each arranged to apply a respective gate control signal to the respective first and second gates of a respective switch to actuate the first and second movable actuators of the respective switch. Each respective gating circuitry may comprise a respective driver channel electrically coupled to a respective common connector of the respective switch and may be adapted to electrically float with respect to a varying beam voltage of the respective switch, and may be electrically referenced between the varying beam voltage of the respective switch and a local electrical ground of the respective gating circuitry.

Yet further aspects of the present invention, in yet another example embodiment may provide a switching apparatus, which may include a switching circuitry comprising at least one micro-electromechanical system switch having a first movable actuator and a second movable actuator jointly electrically connected by a common connector and arranged to selectively establish an electrical current path through the first and second movable actuators in response to a single gate control signal applied to respective first and second gates of the switch to actuate the first and second movable actuators of the switch. A gating circuitry may be used to generate the single gate control signal applied to the first and second gates of the switch, wherein the gating circuitry is electrically referenced to a varying voltage at the common connector of the switch and the common connector is adapted to electrically float with respect to a system ground, and a local electrical ground of the gating circuitry. The switching circuitry may comprise a plurality of respective micro-electromechanical system switches connected in series circuit to one another to establish the current path through the first and second movable actuators of each respective switch. The gating circuitry may comprise a corresponding plurality of respective gating circuitries each arranged to apply a respective gate control signal to the respective first and second gates of a respective switch to actuate the first and second movable actuators of the respective switch. Each respective gating circuitry may be electrically isolated from but electrically referenced to a varying voltage at a respective common connector of the respective switch and the respective common connector may be adapted to electrically float with respect to the system ground, and a respective local electrical ground of the respective gating circuitry.

BRIEF DESCRIPTION OF THE DRAWINGS

The invention is explained in the following description in view of the drawings that show.

DETAILED DESCRIPTION OF THE INVENTION

In accordance with embodiments of the present invention, structural and/or operational relationships, as may be used to provide voltage scalability (e.g., to meet a desired voltage rating) in a switching array based on micro-electromechanical systems (MEMS) switches are described herein. Presently, MEMS generally refer to micron-scale structures that for example can integrate a multiplicity of functionally distinct elements, e.g., mechanical elements, electromechanical elements, sensors, actuators, and electronics, on a common substrate through micro-fabrication technology. It is contemplated, however, that many techniques and structures presently available in MEMS devices will in just a few years be available via nanotechnology-based devices, e.g., structures that may be smaller than 100 nanometers in size. Accordingly, even though example embodiments described throughout this document may refer to MEMS-based switching devices, it is submitted that the inventive aspects of the present invention should be broadly construed and should not be limited to micron-sized devices.

In the following detailed description, numerous specific details are set forth in order to provide a thorough understanding of various embodiments of the present invention. However, those skilled in the art will understand that embodiments of the present invention may be practiced without these specific details, that the present invention is not limited to the depicted embodiments, and that the present invention may be practiced in a variety of alternative embodiments. In other instances, well known methods, procedures, and components have not been described in detail.

Furthermore, various operations may be described as multiple discrete steps performed in a manner that is helpful for understanding embodiments of the present invention. However, the order of description should not be construed as to imply that these operations need be performed in the order they are presented, nor that they are even order dependent. Moreover, repeated usage of the phrase “in one embodiment” does not necessarily refer to the same embodiment, although it may. Lastly, the terms “comprising”, “including”, “having”, and the like, as used in the present application, are intended to be synonymous unless otherwise indicated.

Figure 1:
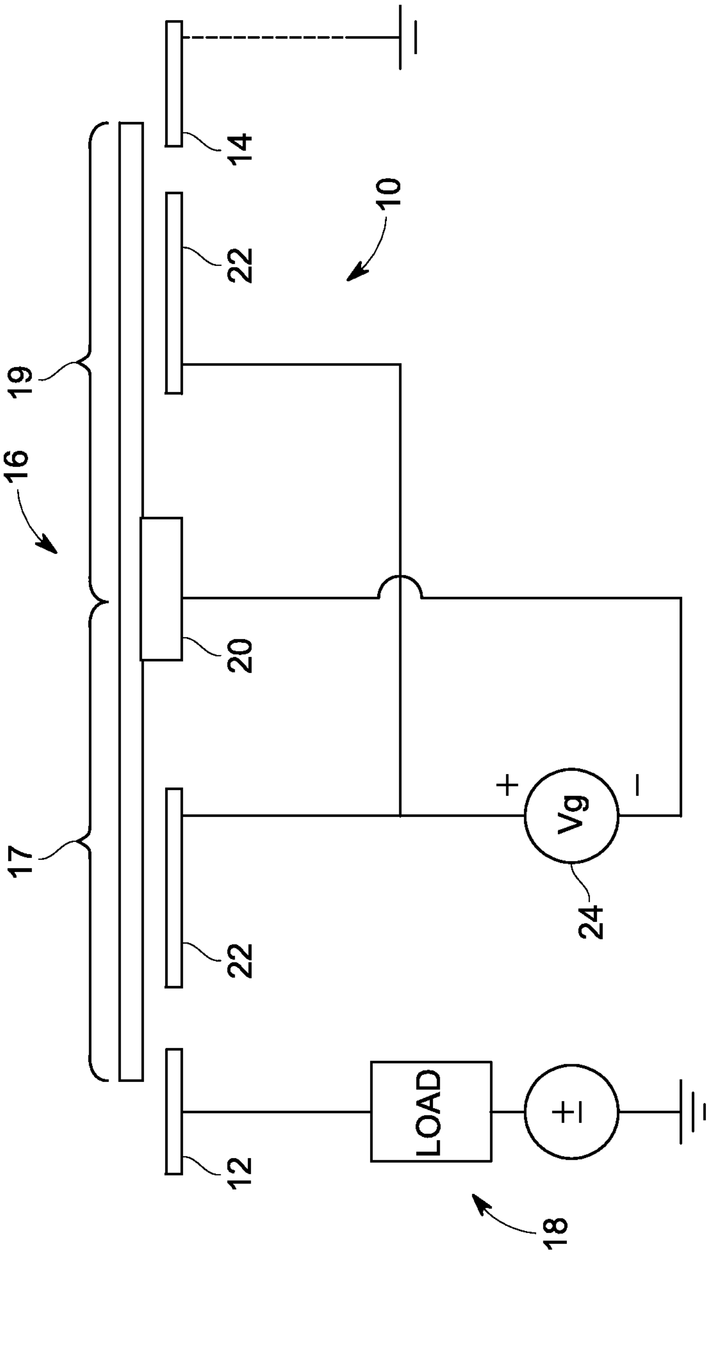
FIG. 1 is a schematic representation of one example embodiment of a MEMS switch, which may benefit from aspects of the present invention. The structural arrangement of the illustrated MEMS switch is colloquially referred to in the art as a Back-to-Back (B2B) MEMS switching structure.

FIG. 1 is a schematic representation of one example embodiment of a MEMS switch 10, which may benefit from aspects of the present invention. The structural arrangement of the illustrated MEMS switch 10 is colloquially referred to in the art as a Back-to-Back (B2B) MEMS switching structure, which has proven to provide enhanced voltage standoff capability for a given gating element.

In the illustrated embodiment, MEMS switch 10 includes a first contact 12 (sometimes referred to as a source or input contact), a second contact 14 (sometimes referred to as a drain or output contact), and a movable actuator 16 (sometimes referred to as a beam), which may be made up of first and second movable actuators 17 and 19 jointly electrically connected by a common connection. In one example embodiment, first and second movable actuators 17 and 19 may be supported by a common anchor 20, which may function as the common connection (e.g., common connector) to electrically interconnect the first and second movable actuators 17 and 19. In one embodiment, contacts 12, 14 may be actuated to be electrically coupled to one another, as part of a load circuit 18 by way of movable actuator 16, which functions to pass electrical current from first contact 12 to second contact 14 upon actuation of the switch to an “on” switching condition. In accordance with one aspect of the present invention, MEMS switch 10 may include respective gates 22 controlled by a common gating circuitry 24 (labeled Vg) configured to impart an electrostatic attraction force upon both first and second actuating elements 17 and 19.

Figure 2:
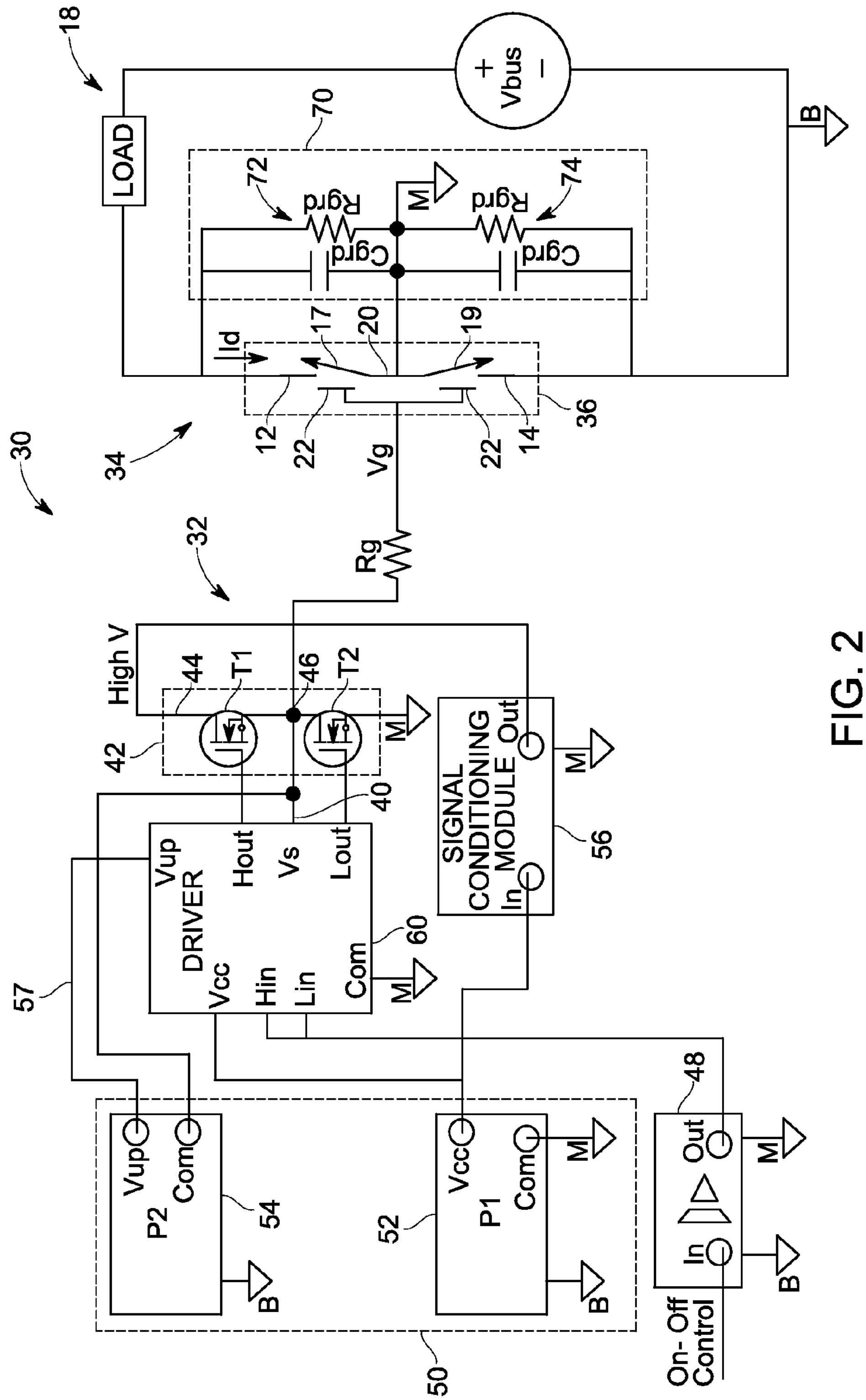
FIG. 2 is a block diagram representation of an apparatus embodying aspects of the present invention including an example embodiment of gating circuitry for actuating a B2B MEMS switch.
Figure 3:
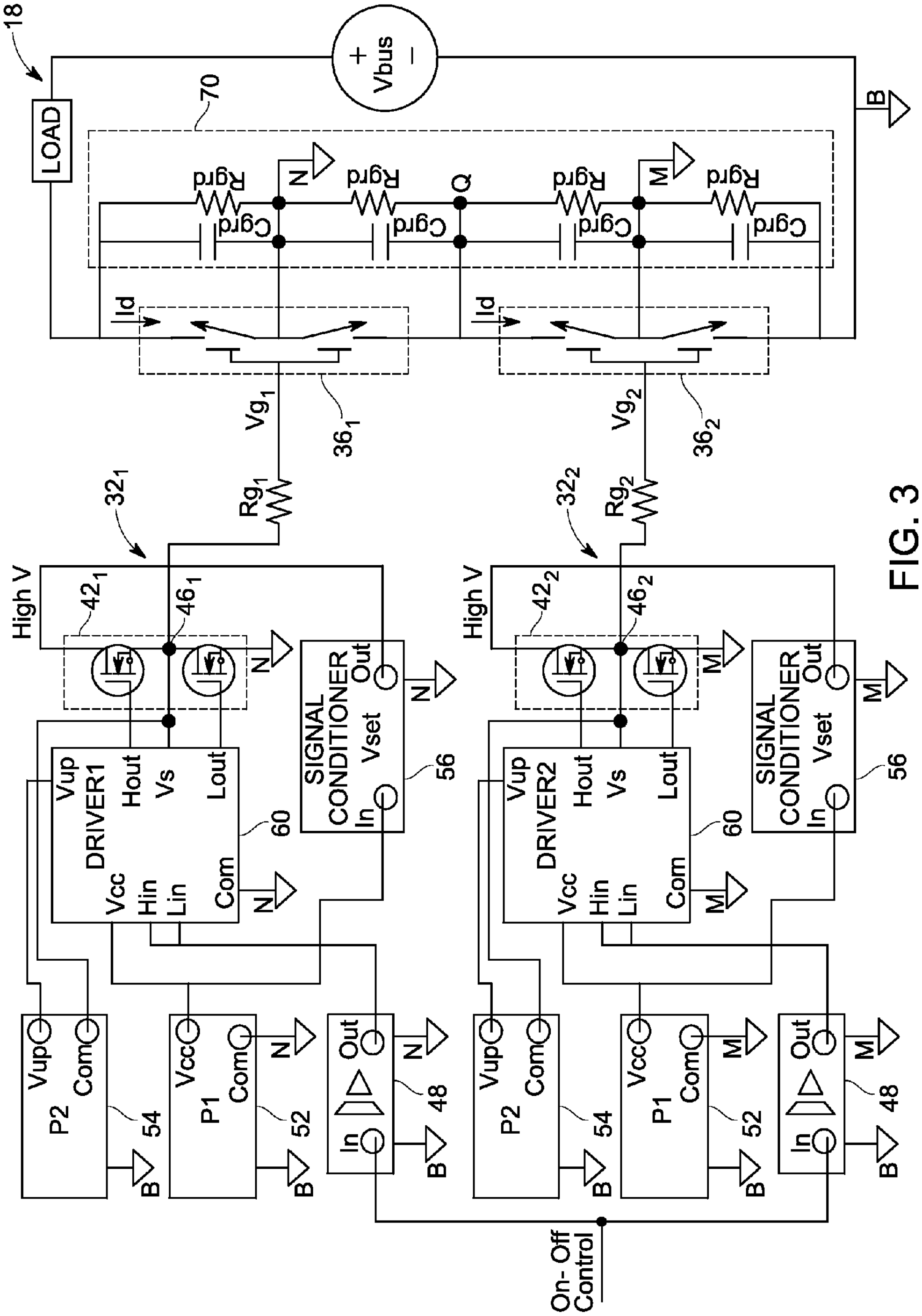
FIG. 3 is a block diagram representation of an apparatus embodying aspects of the present invention involving a plurality of the gating circuitries shown in FIG. 2 for actuating a serially-stacked plurality of B2B MEMS switches.

Example details of gating circuitry embodying aspects of the invention will be described below in the context of FIGS. 2 and 3. FIG. 2 illustrates gating circuitry (e.g., a basic building block) in the context of a single MEMS B2B switching structure, and FIG. 3 illustrates a plurality of the gating circuitries (e.g., two gating circuitries) illustrated in FIG. 2 in the context of a serially-stacked plurality of MEMS B2B switching structures (e.g., two MEMS B2B switching structures). It will be appreciated by those skilled in the art that aspects of the present invention are not limited to any specific number of serially-stacked MEMS switches and thus the number of switches illustrated in FIG. 3 should be construed in an example sense and not in a limiting sense. It will be further appreciated by those skilled in the art that the description below, which is given in the context of a serially-stacked array of MEMS switching structures, should be construed in an example sense and not in a limiting sense since aspects of the present invention are not limited to serially-stacked architectures. For example, the series array may be scalable by way of parallel arrays, such as may increase the amount of current handled by a resulting array, or increase the number of channels in the array, etc. This stackability may be accomplished on a circuit chip—colloquially referred in the art as on-chip (e.g., die level integration)—; off-chip (e.g., involving multiple discrete die dice); or both.

In one example embodiment, the actuation voltage may be imparted simultaneously to each gate 22 and hence to each actuating element. It will be appreciated that the gating signals need not be imparted simultaneously since there may be applications where the gating signals may be non-simultaneously applied, such as when one may desire to selectively control the gating profile over a time interval and/or stagger individualized switch openings to, for example, gradually increase resistance and thus gradually shed current (e.g., fault protection, soft starters, etc.).

By sharing a common gating signal electrically referenced to the common connector (e.g., anchor 20) of the MEMS switch 10, a relatively large with-stand voltage, which could otherwise surpass the with-stand voltage for a conventional MEMS switch, would be shared between the first actuating element and the second actuating element. For example, if a voltage of 200 v was placed across first contact 12 and second contact 14, and a potential at common anchor 20 was graded to 100 v, the voltage between first contact 12 and first actuating element 17 would be approximately 100 v while the voltage between second contact 14 and second actuating element 19 would also be approximately 100 v. Thus, effectively doubling the voltage capability of a MEMs switch having a single gate drive signal.

FIG. 2 is a block diagram representation of an apparatus 30 embodying aspects of the present invention including an example embodiment of a gating circuitry 32 for actuating a B2B MEMS switch 36, as described above in the context of FIG. 1. In one example embodiment, a switching circuitry 34 may include at least one micro-electromechanical system switch 36 having a beam made up of a first movable actuator 17 and a second movable actuator 19 jointly electrically connected by a common connector. In one example embodiment, first and second movable actuators 17 and 19 may be supported by a common anchor 20, which may function as the common connector arranged to electrically interconnect first and second movable actuators 17 and 19 and selectively establish an electrical current path (e.g., to pass current Id in connection with load circuit 18) through first and second movable actuators 17, 19 in response to a single gate control signal (labeled Vg) applied to respective first and second gates 22 of the switch to actuate the first and second movable actuators of the switch. In one example embodiment, since first and second movable actuators 17 and 19 are electrically coupled to common anchor 20, common anchor 20 would be at the same electrical potential as the conduction path of actuators 17, 19.

Gating circuitry 32 is designed to generate the single gate control signal applied to first and second gates 22 of the switch. In one example embodiment, gating circuitry 32 includes a driver channel 40 electrically coupled (without a conductive connection, no galvanic connection) to the common connector (e.g., common anchor 20) of the switch and adapted to electrically float with respect to a varying beam voltage, and electrically referenced between the varying beam voltage and a local electrical ground of the gating circuitry. That is, gating circuitry 32 (i.e., driver channel 40 of gating circuitry 32) is electrically isolated (galvanically isolated) from, but electrically referenced to a varying voltage at the common connector of the switch (e.g., varying beam voltage) and the common connector is adapted to electrically float with respect to a system ground (e.g., labeled B) and a local common (e.g., local electrical ground labeled M) of the switch and the gating circuitry.

In one example embodiment, gating circuitry 32 may include a pair of transistors (labeled T1 and T2) connected to define a half-bridge circuit 42. Transistors T1, T2 may be solid-state transistors, such as field-effect transistors (FET) and the like. In one example embodiment, a first side of half-bridge circuit 42 may include an input stage 44 (e.g., drain terminal of transistor T1) to receive a voltage level sufficiently high to actuate the first and second movable actuators 17, 19 when applied to the respective first and second gates 22 of the switch.

In one example embodiment, a second side of half-bridge circuit 42 (e.g., source terminal of transistor T2) may be referenced to the electric potential at the common anchor 20 of the switch. An intermediate node 46 of the half-bridge circuit is electrically coupled to driver channel 40 and to first and second gates 22 of the switch to apply the gating signal to actuate the first and second movable actuators 17, 19 of the switch based on a logic level of a switching control signal (e.g., labeled on-off control), as may be electrically isolated by an appropriate isolator device 48, such as a standard opto-coupler or isolation transformer. In one example embodiment, intermediate node 46 of half-bridge circuit 42 may be electrically coupled to the first and second gates 22 of the switch by way of a resistive element (e.g., labeled Rg).

It will be appreciated that aspects of the present invention are not limited to utilization of a half-bridge circuit for the gating circuitry. As will be now appreciated by those skilled in the art, depending on the specific needs of a given application, the gating circuitry may be implemented by way of a variety of alternative embodiments, such as a high-voltage linear amplifier, a piezoelectric transformer (PZT), a charge pump, an optically-powered gating circuitry, a converter (e.g., DC-to-DC converter) or any gating circuitry capable of appropriately following sufficiently fast line transients.

In one example embodiment, a power circuitry 50 may include a first voltage source 52 (labeled P1) coupled to a signal conditioning module 56 (e.g., a DC-to-DC converter) to generate the sufficiently-high voltage level supplied to input stage 44 of half-bridge circuit 42. Power circuitry 50 may further include a second voltage source 54 (labeled P2) coupled to a driver 60 of the pair of transistors T1, T2. In one example embodiment, driver 60 may be a standard half-bridge driver, such as part number IRS2001, commercially available from International Rectifier. As noted above, it will be appreciated that aspects of the present invention are not limited to use of a half-bridge driver and much less to any specific half-bridge driver and thus the foregoing example should not be construed in a limiting sense.

Second voltage source 54 may be arranged to supply a floating voltage by way of line 57 to energize a high-side output of half-bridge driver 60. This floating voltage may be referenced with respect to the electric potential at intermediate node 46 of half-bridge circuit 42. It will be appreciated that the electrical floating and isolating of the foregoing circuits allows gating circuitry 32 to dynamically track rapidly-varying conditions (e.g., varying beam voltage), which can develop at common anchor 20 during transient conditions. This dynamic tracking should be sufficiently fast relative to the mechanical response of a given beam, generally measured by its resonant period (e.g., inverse of resonant frequency), which may be in the order of microseconds or faster. It will be appreciated that aspects of the present invention are not limited to power circuitry involving discrete voltage sources. For example, if in a given system, the high voltage level for input stage (44) is already available, it will be appreciated that such high voltage level may be readily used in lieu of first voltage source 52 and signal conditioning module 56. In one example embodiment, second voltage source 54 can be set to continually supply the floating voltage to energize the high-side output of driver 60 for a relatively long period of time, (e.g., days, weeks or longer) as would be useful in a load protection application (e.g., circuit breakers, relays, contactors, resettable fuses, etc.), as may involve a respective set of contacts to interrupt circuit continuity.

This represents one example practical advantage provided by aspects of the present invention over known circuits, which commonly involve a bootstrapping diode, and consequently such long-term supply of floating voltage (e.g., without a bootstrapping diode) is presently realizable with gating circuitry embodying aspects of the present invention.

A prototype apparatus embodying aspects of the present invention has been effectively demonstrated by way of circuitry involving discrete components. As should be now appreciated by those skilled in the art, it is contemplated that circuitry embodying aspects of the present invention could be implemented by way of an Application-Specific Integrated Circuit (ASIC).

It will be appreciated that aspects of the present invention may be utilized in a variety of applications, such as may involve direct current (DC) loads, or may involve alternating current (AC) loads, such as where a signal frequency (e.g., modulation frequency) may have a value relatively lower than the frequency switching speed of the MEMS switch, or for applications where the signal frequency may have a value relatively higher than the frequency switching speed of the MEMS switch (e.g., radio frequency (RF) signals). FIG. 2 further illustrates a graded network 70 electrically coupled to the respective micro-electromechanical system switch 36. In one example embodiment, graded network 70 may include a first resistor-capacitor (RC) circuit 72 connected between first contact 12 and common anchor 20. Graded network 70 may further include a second resistor-capacitor (RC) circuit 74 connected between second contact 14 of the switch and common anchor 20. In one example embodiment, the respective RC time constants of first and second resistor-capacitor circuits 72, 74 may be selected to dynamically balance a transition of the electrical potential at the common anchor relative to the respective potentials at the first and second contacts 12, 14 during a switching event. In one example embodiment, as a practical example guideline and not as a limitation, the RC time constants of the grading network may be on the order of approximately 1/10 the resonant period of the MEMS switch.

FIG. 3 illustrates two serially-stacked B2B MEMS switches 36$_1$,36$_2$ respectively driven by gating circuitries 32$_1$, 32$_2$, as described above in the context of FIG. 2. It will be appreciated that in accordance with aspects of the present invention, such gating circuitries provide appropriate operation in the presence of dynamically shifting transient voltage levels that may develop in the serially-stacked switching circuitry, such as at nodes N, M, and Q to maintain appropriate gate-to-anchor biasing levels for each of the serially-stacked switches, e.g., switches 36$_1$,36$_2$ and prevent undesirable overvoltage conditions, which could otherwise develop at the contacts of the switches.

It will be appreciated that nodes N and M correspond to the respective electric potentials at the respective anchors of switches 36$_1$,36$_2$, while node Q represents the electric potential at the junction of the serially-stacked switches 36$_1$,36$_2$. It is noted that although node Q is not a midpoint of a B2B MEMS device, and thus not a gate drive reference, in operation this node should also be similarly balanced, as nodes N and M are. It will be appreciated that gating circuitry embodying aspects of the present invention allows keeping the respective voltages essentially evenly distributed at nodes N, Q, and M.

In operation, the floating and isolating of the respective gating circuitries 32$_1$, 32$_2$ allow such circuitries to dynamically "move" in voltage with the shifting conditions at nodes N, M, and Q. For example, nodes N and M (the respective references for gate voltages Vg1 and Vg2) can be dynamically brought towards ground B, for example, during a switching closure event of the respective MEMS switches 36$_1$,36$_2$. It will be appreciated that prior to the switching closure event, such nodes could, for example, be at tens or hundreds of volts, however, as noted above, the respective gating circuitries 32$_1$,32$_2$ ensure appropriate gate-to-anchor biasing levels during the switching closure event for each of the serially-stacked switches, thereby preventing overvoltage conditions which could otherwise develop at a free-end of a given beam and a corresponding contact of the given switch.

In one example embodiment, switches 36$_1$,36$_2$ is each responsive to a single switching control signal (labeled On-Off Control) simultaneously applied to the plurality of respective gating circuitries. It will be appreciated that the switching control signal need not be a single signal derived from a single logic-level on-off control. For example, the switching control may be provided by way of separate control signals.

Figure 4:
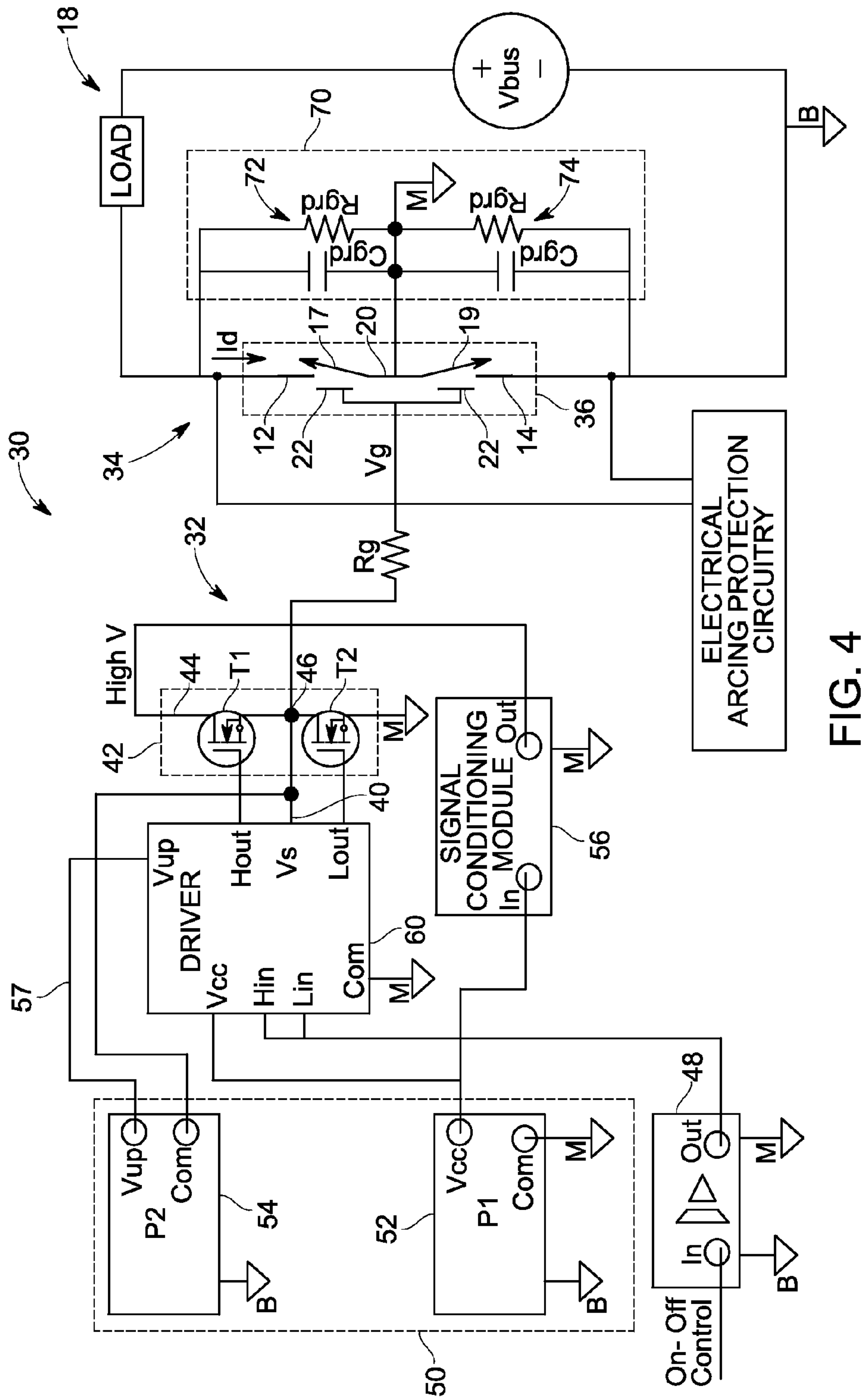
FIG. 4 is a block diagram representation of an apparatus embodying aspects of the present invention including the gating circuitry of FIG. 2 in combination with electrical-arcing protection circuitry.

FIG. 4 is a block diagram representation of an apparatus embodying further aspects of the present invention, as may include the gating circuitry of FIG. 2 in combination with an electrical-arcing protection circuitry 100. One example embodiment of such circuitry may involve a hybrid arc limiting technology (HALT) circuitry. For readers desirous of general background information regarding such a circuitry, reference is made by way of example to U.S. Pat. Nos. 8,050,000 and 7,876,538, each titled "Micro-Electromechanical System Based Arc-Less Switching With Circuitry For Absorbing Electrical Energy During A Fault Condition"; and U.S. Pat. No. 4,723,187, titled, "Current Commutation Circuit, which are herein incorporated by reference in their entirety. One skilled in the art would appreciate that arcing-protection circuitry 100 may protect the electrical device (e.g., MEMS switch 36) from arcing during an interruption of a load current and/or of a fault current. In one non-limiting example application, an array of MEMS switches may service, for instance, a motor-starter system. In one example embodiment, arc-protection circuitry 100 may involve diode bridge circuitry and pulsing techniques adapted to suppress arc formation between contacts of the MEMS switch. In such an embodiment, arc formation suppression may be accomplished by effectively shunting a current flowing through such contacts.

While various embodiments of the present invention have been shown and described herein, it is noted that such embodiments are provided by way of example only. Numerous variations, changes and substitutions may be made without departing from the invention herein. Accordingly, it is intended that the invention be limited only by the spirit and scope of the appended claims.

The invention claimed is:

1. A switching apparatus comprising:

a switching circuitry comprising at least one micro-electromechanical system switch having a beam comprising a first movable actuator and a second movable actuator jointly electrically connected by a common connector and arranged to selectively establish an electrical current path through the first and second movable actuators in response to a single gate control signal applied to respective first and second gates of the switch to actuate the first and second movable actuators of the switch; and a gating circuitry to generate the single gate control signal applied to the first and second gates of the switch, wherein the gating circuitry comprises a driver channel electrically coupled to the common connector of the switch and adapted to electrically float with respect to a varying beam voltage, and electrically referenced between the varying beam voltage and a local electrical ground of the gating circuitry.

2. The apparatus of claim 1, wherein the common connector comprises an anchor which jointly supports the first and second movable actuators.

3. The apparatus of claim 1, wherein the switching circuitry comprises an array of respective micro-electromechanical system switches connected in series circuit to one another to establish the current path through the first and second movable actuators of each respective switch, wherein the gating circuitry comprises a corresponding plurality of further respective gating circuitries each arranged to apply a respective gate control signal to the respective first and second gates of a respective switch to actuate the first and second movable actuators of the respective switch.

4. The apparatus of claim 3, wherein the array of respective micro-electromechanical system switches is expandable by way of further micro-electromechanical system connected in parallel circuit, series circuit or both.

5. The apparatus of claim 4, wherein the array of respective micro-electromechanical system switches is arranged on-chip, off-chip or both.

6. The apparatus of claim 3, wherein each respective gating circuitry comprises a respective driver channel electrically coupled to a respective common connector of the respective switch and adapted to electrically float with respect to a varying beam voltage of the respective switch, and electrically referenced between the varying beam voltage of the respective switch and a local electrical ground of the respective gating circuitry.

7. The apparatus of claim 3, wherein the plurality of respective gating circuitries is responsive to a single switching control signal or separate control signals simultaneously or non-simultaneously applied to the plurality of respective gating circuitries.

8. The apparatus of claim 1, wherein the gating circuitry comprises a pair of transistors connected to define a half-bridge circuit, wherein a first side of the half-bridge circuit comprises an input stage to receive a voltage level sufficient to actuate the first and second movable actuators when applied to the respective first and second gates of the switch, wherein a second side of the half-bridge circuit is referenced to the potential at the common connector of the switch, and wherein an intermediate node of the half-bridge circuit is electrically coupled to the driver channel and to the first and second gates of the switch to apply the gating signal to actuate the first and second movable actuators of the switch based on a logic level of a switching control signal.

9. The apparatus of claim 1, wherein the gating circuitry comprises circuitry selected from the group consisting of a half-bridge circuit, a linear amplifier, a piezoelectric transformer, a charge pump, a converter, and an optically-powered gating circuitry.

10. The apparatus of claim 8, wherein the intermediate node of the half bridge circuit is electrically coupled to the first and second gates of the switch by way of a resistive element.

11. The apparatus of claim 1, further comprising a power circuitry comprising a first voltage source coupled to a signal conditioning module to generate the voltage level supplied to the input stage of the half bridge circuit, wherein the voltage level is referenced with respect to the potential at the common connector of the switch.

12. The apparatus of claim 11, wherein the power circuitry further comprises a second voltage source coupled to a driver of the pair of transistors, the second voltage source arranged to supply a floating voltage to energize a high-side output of the driver of the pair of transistors, the floating voltage being referenced with respect to a potential at the intermediate node of the half-bridge circuit.

13. The apparatus of claim 12, wherein the second voltage source can be set to continually supply the floating voltage to energize the high-side output of the driver of the pair of transistors for a relatively long period of time.

14. The apparatus of claim 1, further comprising a graded network electrically coupled to the respective micro-electromechanical system switch, the graded network comprising a first resistor-capacitor circuit connected between a first contact connectable to the first movable actuator of the switch and the common connector, the graded network further comprising a second resistor-capacitor circuit connected between a second contact connectable to the second movable actuator of the switch and the common connector, wherein respective time constants of the first and second resistor-capacitor circuits are selected to dynamically balance a transition of the potential at the common connector relative to the respective potentials at the first and second contacts during a switching event.

15. A set of contacts comprising the apparatus of claim 1.

16. The switching apparatus of claim 1, wherein the electrical current path established by the switching circuitry is operatively coupled to a load, wherein the load comprises a load selected from the group consisting of a direct current (DC) load, an alternating current (AC) load and a radio-frequency (RF) load.

17. The switching apparatus of claim 1, wherein the electrical current path established by the switching circuitry is operatively coupled to an alternating current (AC) load, wherein the AC load is selected from the group consisting of a signal having a frequency value relatively lower than a frequency switching speed of the switch, and a signal having a frequency value relatively higher than the frequency switching speed of the switch.

18. The switching apparatus of claim 1, further comprising an electrical arcing-protection circuitry coupled across respective contacts of the micro-electromechanical system switch.

19. A switching apparatus comprising:

a switching circuitry comprising at least one micro-electromechanical system switch having a beam comprising a first movable actuator and a second movable actuator jointly electrically connected by a common connector and arranged to selectively establish an electrical current path through the first and second movable actuators in response to a single gate control signal applied to respective first and second gates of the switch to actuate the first and second movable actuators of the switch; and a gating circuitry to generate the single gate control signal applied to the first and second gates of the switch, wherein the gating circuitry comprises a driver channel electrically coupled to the common connector of the switch and adapted to electrically float with respect to a varying beam voltage, and electrically referenced between the varying beam voltage and a local electrical ground of the gating circuitry, wherein the switching circuitry comprises an array of respective micro-electromechanical system switches connected in series circuit to one another to establish the current path through the first and second movable actuators of each respective switch, wherein the gating circuitry comprises a corresponding plurality of respective gating circuitries each arranged to apply a respective gate control signal to the respective first and second gates of a respective switch to actuate the first and second movable actuators of the respective switch, and wherein each respective gating circuitry comprises a respective driver channel electrically coupled to a respective common connector of the respective switch and adapted to electrically float with respect to a varying beam voltage of the respective switch, and electrically referenced between the varying beam voltage of the respective switch and a local electrical ground of the respective gating circuitry.

20. The apparatus of claim 19, wherein the array of respective micro-electromechanical system switches is expandable by way of further micro-electromechanical system connected in parallel circuit, series circuit or both.

21. The apparatus of claim 19, wherein a respective gating circuitry comprises a pair of transistors connected to define a half-bridge circuit, wherein a first side of the half-bridge circuit comprises an input stage to receive a voltage level sufficient to actuate the first and second movable actuators of the respective switch when applied to the respective first and second gates of the respective switch, wherein a second side of the half-bridge circuit is referenced to the varying beam voltage of the respective switch, and wherein an intermediate node of the half-bridge circuit is electrically coupled to the respective driver channel and to the first and second gates of the respective switch to apply the respective gating signal to actuate the respective first and second movable actuators of the respective switch based on a logic level of a switching control signal.

22. The apparatus of claim 21, wherein the intermediate node of the half-bridge circuit is electrically coupled to the first and second gates of the respective switch by way of a resistive element.

23. The apparatus of claim 22, further comprising a plurality of respective power circuitries, wherein a respective power circuitry comprises a first voltage source coupled to a signal conditioning module to generate the voltage level supplied to the input stage of the half bridge circuit, wherein the voltage level is referenced to the varying beam voltage of the respective switch.

24. The apparatus of claim 23, wherein the respective power circuitry further comprises a second voltage source coupled to a driver of the pair of transistors, the second voltage source arranged to supply a floating voltage to energize a high-side output of the driver of the pair of transistors, the floating voltage being referenced to a potential at the intermediate node of the half-bridge circuit.

25. The apparatus of claim 24, wherein the second voltage source can be set to continually supply the floating voltage to energize the high-side output of the driver of the pair of transistors for a relatively long period of time.

26. The apparatus of claim 20, further comprising a plurality of graded networks electrically coupled to the plurality of respective micro-electromechanical system switches, wherein a graded network comprises a first resistor-capacitor circuit connected between a first contact connectable to the first movable actuator of the respective switch and the common anchor, the graded network further comprising a second resistor-capacitor circuit connected between a second contact connectable to the second movable actuator of the respective switch and the common anchor, wherein respective time constants of the first and second resistor-capacitor circuits are selected to dynamically balance a transition of the potential at the common anchor relative to the respective potentials at the first and second contacts during a switching event.

27. A set of contacts comprising the apparatus of claim 20.

28. A switching apparatus comprising:

a switching circuitry comprising at least one micro-electromechanical system switch having a first movable actuator and a second movable actuator jointly electrically connected by a common connector and arranged to selectively establish an electrical current path through the first and second movable actuators in response to a single gate control signal applied to respective first and second gates of the switch to actuate the first and second movable actuators of the switch; and a gating circuitry to generate the single gate control signal applied to the first and second gates of the switch, wherein the gating circuitry is electrically referenced to a varying voltage at the common connector of the switch and the common connector is adapted to electrically float with respect to a system ground, and a local electrical ground of the gating circuitry, wherein the switching circuitry comprises a plurality of respective micro-electromechanical system switches connected in series circuit to one another to establish the current path through the first and second movable actuators of each respective switch, wherein the gating circuitry comprises a corresponding plurality of respective gating circuitries each arranged to apply a respective gate control signal to the respective first and second gates of a respective switch to actuate the first and second movable actuators of the respective switch, and wherein each respective gating circuitry is electrically isolated from but electrically referenced to a varying voltage at a respective common connector of the respective switch and the respective common connector is adapted to electrically float with respect to the system ground, and a respective local electrical ground of the respective gating circuitry.

* * * * *

UNITED STATES PATENT AND TRADEMARK OFFICE

CERTIFICATE OF CORRECTION

PATENT NO. : 8,659,326 B1
APPLICATION NO. : 13/630122
DATED : February 25, 2014
INVENTOR(S) : Claydon et al.

It is certified that error appears in the above-identified patent and that said Letters Patent is hereby corrected as shown below:

In the Drawings

In Fig. 4, Sheet 4 of 4, delete " 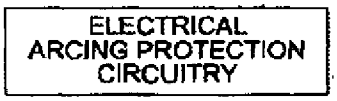

" and insert

-- 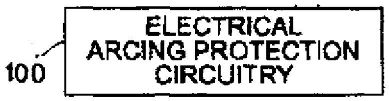

--, therefor.

In the Specification

In Column 5, Line 23, delete "MEMs" and insert -- MEMS --, therefor.

In Column 8, Line 35, delete "titled," and insert -- titled --, therefor.

Signed and Sealed this
Fifth Day of August, 2014

Michelle K. Lee
*Deputy Director of the United States Patent and Trademark Office*